United States Patent [19]

Mori et al.

[11] Patent Number: 4,469,949
[45] Date of Patent: Sep. 4, 1984

[54] ELECTRON BEAM PATTERN TRANSFER DEVICE AND METHOD FOR ALIGNING MASK AND SEMICONDUCTOR WAFER

[75] Inventors: Ichiro Mori, Kodaira; Kazuyoshi Sugihara; Toshiaki Shinozaki, both of Yokohama; Toru Tojo, Yamato, all of Japan

[73] Assignee: Kabushiki Kaisha Toshiba, Tokyo, Japan

[21] Appl. No.: 374,724

[22] Filed: May 4, 1982

[30] Foreign Application Priority Data

May 7, 1981 [JP] Japan .................................. 56-68532

[51] Int. Cl.³ ............................................ H01J 37/00
[52] U.S. Cl. ................................ 250/491.1; 250/492.2
[58] Field of Search .................... 250/396, 492.2, 491.1

[56] References Cited

U.S. PATENT DOCUMENTS

| | | | |
|---|---|---|---|
| 3,683,195 | 8/1972 | Johannsmeier | 250/492.2 |
| 3,710,101 | 1/1973 | O'Keefe | 250/492.2 |
| 3,745,358 | 7/1973 | Firtz et al. | 250/397 |
| 3,843,916 | 10/1974 | Trotel et al. | 250/492.2 |
| 4,335,313 | 6/1982 | Kreuger | 250/492.2 |

OTHER PUBLICATIONS

"An Electron Image Projection with Automatic Alignment", Scott, *IEEE Trans. on Electron Devices*, 22, No. 7, Jul. 1975, pp. 409-413.

*Primary Examiner*—Bruce C. Anderson
*Attorney, Agent, or Firm*—Banner, Birch, McKie & Beckett

[57] ABSTRACT

According to the invention an electron beam pattern transfer device with an improved alignment means is provided.

A first and a second mark $M_1$, $M_2$ for alignment purposes are formed on the surface of the wafer and the wafer holder, respectively. The first mark $M_1$ is formed on the wafer by conventional lithographic technique and the second mark $M_2$ consists of a hole or a heavy metal, such as Ta or $Ta_2O_5$. A third alignment mark $M_3$ is provided on the photocathode mask having a position corresponding to $M_2$ on the wafer holder and spaced a known distance $L_2$ from an imaginary reference position $M_4$ on the mask. The first step of the alignment process requires the detection of a relative distance $L_1$ between the first and second marks $M_1$, $M_2$ by conventional detecting means, such as an optical measuring means. In the next step, the relative position of the photocathode mask and the wafer holder is adjusted so that the distance between the marks $M_2$ and $M_3$ is made substantially equal to the difference between the distance $L_1$ and the known distance $L_2$.

12 Claims, 15 Drawing Figures

ELECTRON BEAM PATTERN TRANSFER DEVICE AND METHOD FOR ALIGNING MASK AND SEMICONDUCTOR WAFER

BACKGROUND OF THE INVENTION

This invention relates to a electron beam pattern transfer device having a photocathode mask and especially to the device and method for providing an accurate alignment between the mask and semiconductor wafer on which the mask pattern is transferred.

Due to the need for high integrated semiconductor circuits, various kinds of new lithographic techniques have been proposed, creating a breakthrough in conventional photo-lithographic techniques. One such technique employs electron beam transfer whereby an electron image projector, having a photoelectric surface mask, is used for transferring patterns from a mask to a semiconductor wafer. More specifically, the electron image projector reproduces high-resolution patterns onto a semiconductor wafer at 1:1 magnification. The desired pattern is imprinted on a quartz substrate mask, and a photocathode is then evaporated on the upper surface. The mask is then illuminated with an ultraviolet lamp which causes electrons to be emitted from the clear areas of the mask; thus the pattern is converted to electrons. The electrons are then accelerated by a high intensity electric field and focused onto the wafer by a magnetic field.

One of the major difficulties encountered in the development of an electron beam pattern transfer device has been the problem of aligning the mask and the wafer, which are usually spaced at approximately 10 mm. Conventional optical techniques such as contact aligners cannot be used since the mask and wafer must be separated to permit acceleration of the electrons. Utilizing secondary electrons which are employed for alignment purposes in conventional scanning beam systems cannot be incorporated in electron beam pattern transfer devices. Secondary electrons are usually trapped by the high intensity electric and magnetic fields and, thus, none will be detected by a detector. Another proposed method utilizes a very small hole formed in the wafer and detects the electrons passing through the hole. Forming such a hole in each wafer, however, is very troublesome and results in a loss of resist thickness and uniformity around the periphery of the hole; consequently, the integrity of the pattern transferred onto the wafer.

A still further proposed method utilizes a reference mark, consisting of heavy metal formed on the wafer, and detects the X-rays produced when photoelectrons are incident on this mark. Formation of this mark, however, is troublesome and the heavy metal, positioned on the wafer, has an adverse effect on the semiconductor's characteristics since it has a tendency of contaminating the device.

SUMMARY OF THE INVENTION

An object of the present invention, therefore, is to provide an electron beam pattern transfer device incorporating an improved alignment means for aligning the photocathode mask and the wafer.

A more specific object of the invention is to provide a method for accurately and easily aligning the mask and the wafer without forming a hole through, or utilizing special metal marks on, the semiconductor wafer, so that high product yield and high product quality can be obtained.

According to the invention an electron beam pattern transfer device with an improved alignment means is provided. The device is provided with a light source for emitting ultraviolet light, such as a low pressure mercury-arc lamp. A pattern mask having a photoelectric surface is spaced from the light source and emits electron beams upon incidents of the ultraviolet light. A semiconductor wafer is supported on a movable holder, which aligns the wafer with, and spaces it from, the photocathode mask. Electron focusing and accelerating means are provided for applying a high intensity magnetic and electric field between the mask and the wafer.

The alignment process proceeds as follows. A first and a second alignment mark $M_1$, $M_2$ are formed on the surface of the wafer and the wafer holder, respectively. The first mark $M_1$ is formed on the wafer by conventional lithographic technique and the second mark $M_2$ consists of a hole or a heavy metal, such as Ta or $Ta_2O_5$. A third alignment mark $M_3$ is provided on the photocathode mask having a position corresponding to $M_2$ on the wafer holder and spaced a known distance $L_2$ from a reference position $M_4$. The first step of the alignment process requires the detection of a relative distance $L_1$ between the first and second marks $M_1$, $M_2$ by conventional detecting means, such as an optical measuring means. In the next step, the relative position of the photocathode mask and the wafer holder is adjusted so that the distance between the marks $M_2$ and $M_3$ is substantially equal to the difference between the distance $L_1$ and the known distance $L_2$. In a further embodiment, rather than adjusting the relative positions by moving a table holding the wafer, the detected relative position between the mask and the wafer holder is used to control the deflection of the electrons to accurately adjust their impingment on the wafer.

Therefore, according to the invention, since the alignment method utilizes a hole or heavy metal mark formed in the wafer holder instead of in the wafer, the difficulty in forming such marks on each wafer and the adverse effects on the characteristics of the semiconductor, due to heavy metal pollution, can be avoided.

DETAILED DESCRIPTION OF THE PREFERRED EMBODIMENT

Figure 1:
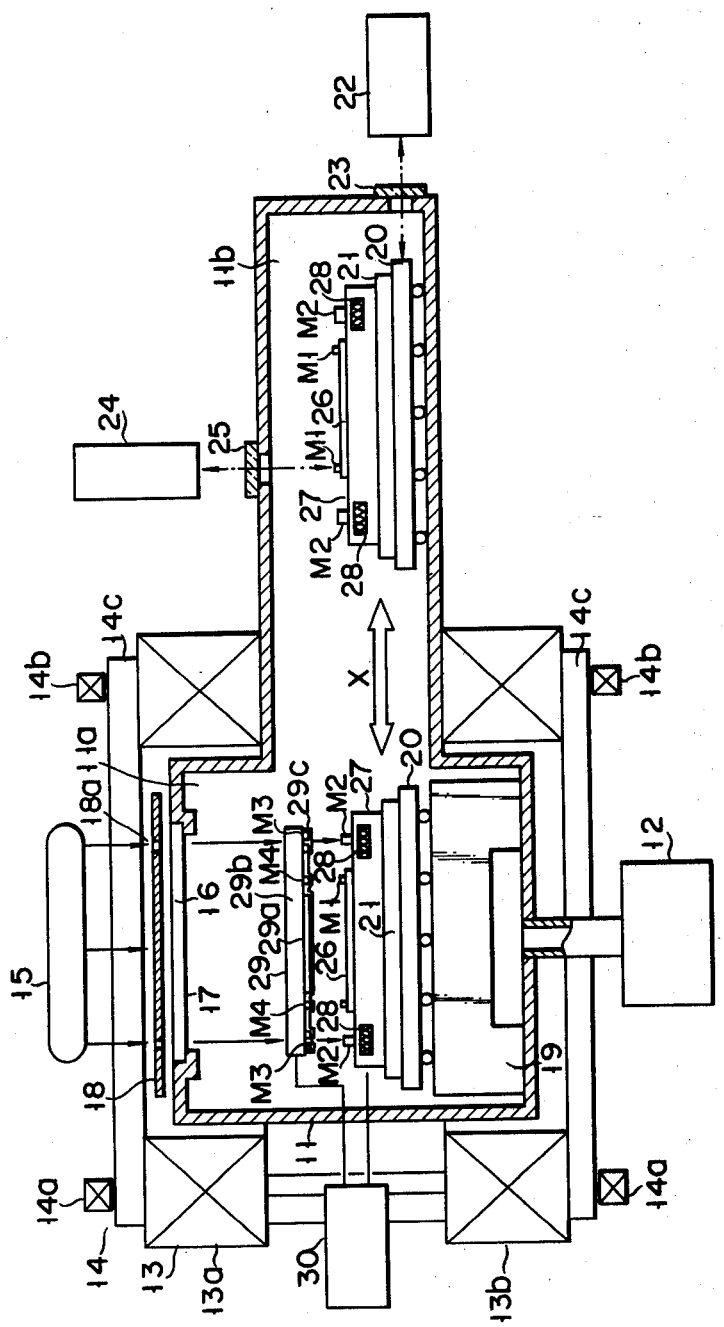
FIG. 1 is a schematic view showing the basic structure of an electron beam transfer device alignment system according to the invention.
Figure 2:
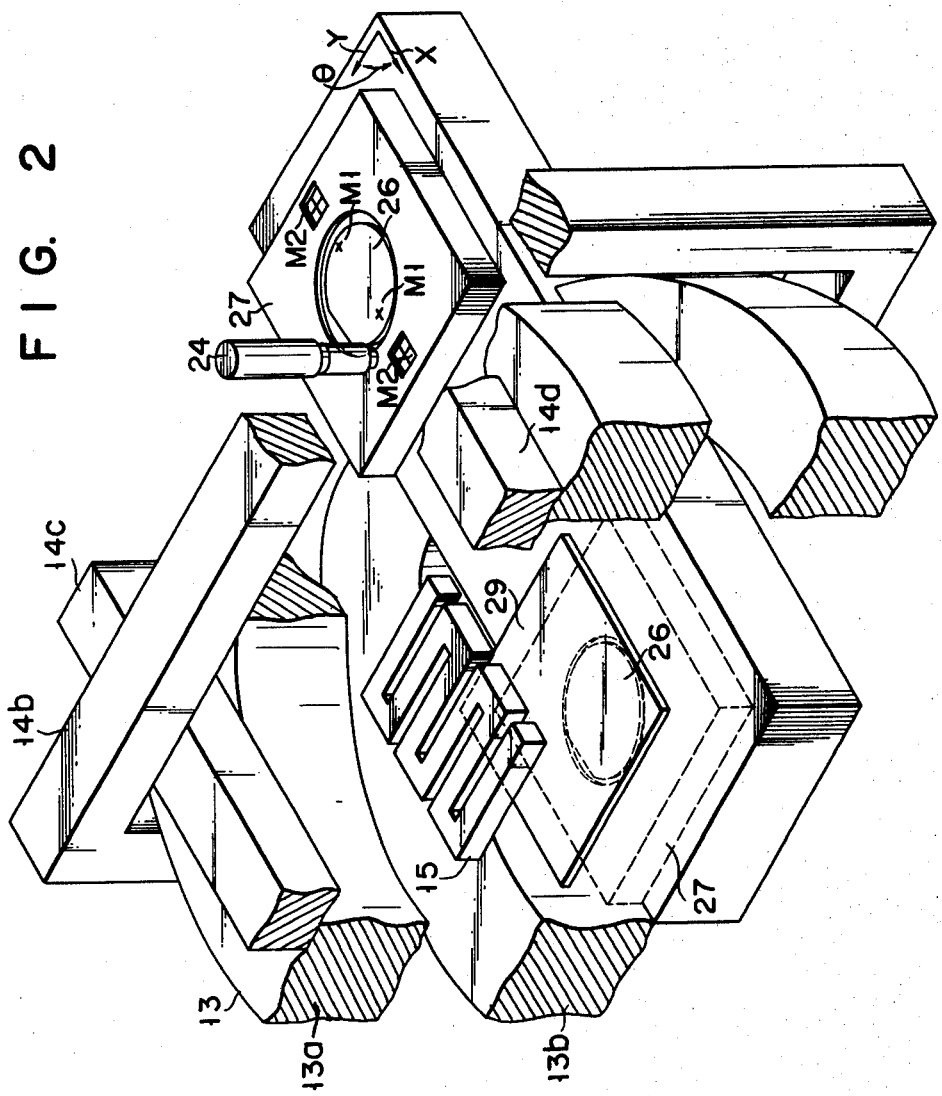
FIG. 2 is a perspective view of a part of the device shown in FIG. 3.

Referring to FIGS. 1-2, a vacuum vessel 11 is shown which has a sample chamber 11a and a preparatory chamber 11b. These chambers are intercoupled so that a table containing the semiconductor wafer can be moved therebetween. The vessel 11 is evacuated by a vacuum pump 12 connected to the bottom of the sample chamber 11a. Outside sample chamber 11a, a focusing magnet 13 is provided having spaced upper and lower annular magnet elements 13a, 13b each surrounding the outer periphery of the sample chamber 11a. A deflection coil 14 having four rectangular coils elements 14a–14d (14d not shown) is provided which surround focusing magnet 13. Focusing magnet 13 provides a magnetic field along the vertical direction within sample chamber 11a. Deflection coil 14 provides a magnetic field along the transverse direction within sample chamber 11a.

A light source 15 is provided above the sample chamber 11a for illuminating the interior of chamber 11a. Light source 15 is, for example, a low pressure mercury-arc lamp emitting ultra-violet light through a transparent plate 16 mounted within an upper opening 17 of sample chamber 11a. A screening plate 18 having a transparent portion 18a is utilized during the alignment process, as will be discussed. It is removably positioned between light source 15 and transparent plate 16 for selectively passing ultra-violet light into the chamber through transparent portion 18a or opening 17. A base member 19 is positioned on the bottom of sample chamber 11a; its upper surface is aligned with the bottom surface of preparatory chamber 11b.

An X-Y table 20 is provided for transporting a semiconductor wafer 26 between sample chamber 11a and preparatory chamber 11b. Specifically, it moves in both the X and Y directions along the upper surface of base member 19 and along the bottom surface of preparatory chamber 11b, as shown by the X-Y coordinates in FIG. 2. A rotating table 21 is rotatably mounted on X-Y table 20; it can be rotated in the $\theta$ direction on the X-Y table 20, as shown by the $\theta$ coordinate in FIG. 2. A laser interferometer 22 for measuring the position of movement of the X-Y table 20 is provided outside preparatory chamber 11b. Interferometer 22 transmits and receives a laser beam through a window 23 to, and from, the side edge of the X-Y table 20 for determining the position of table 20 in the X direction. An additional interferometer is provided (not shown) for measuring the Y position of table 20. A photocathode microscope 24 is provided above preparatory chamber 11b for detecting, through a window 25 on the upper wall of chamber 11b, the marks formed on the semiconductor wafer and its holder which are carried by the X-Y table.

Figure 3:
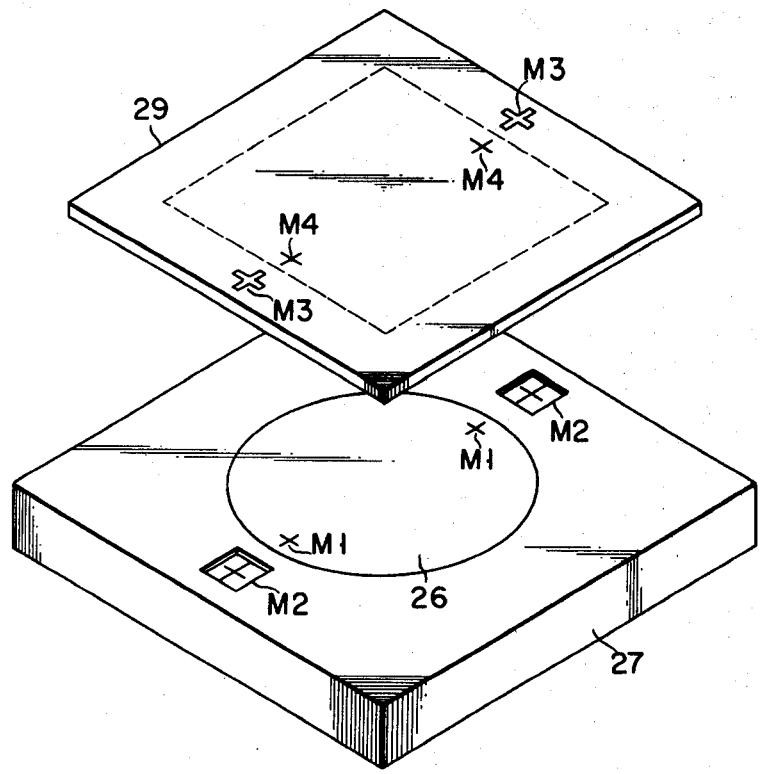
FIG. 3 is a perspective view showing an example of the arrangement of the various alignment marks on the mask, wafer, and wafer support shown in FIG. 1.

A semiconductor wafer 26 such as a silicon is fixedly held in a holder 27 such as a cassette which is mounted on rotating table 21. A first set of spaced marks $M_1$ are provided for the alignment purposes at the opposite peripheral portions on the surface of wafer 26, as shown in FIG. 3. First marks $M_1$ are formed on the wafer by conventional lithographic techniques, such as mask patterning, exposure, etching, etc. A second set of spaced marks $M_2$ are provided on the surface of wafer holder 27 on the peripheral portions of holder 27. These first and second marks are preferably arranged along a straight line passing through the center portion of wafer 26. Second marks $M_2$ consist of either a small through hole or a heavy metal, such as tantalum (Ta) or tantalium oxide ($Ta_2O_5$) which produces X-rays when irradiated by photoelectrons. Provided within wafer holder 27 directly below each mark $M_2$ is a detector 28 which detects the intensity of the X-rays or electron beam.

A photocathode mask 29 is provided within sample chamber 11a at a position opposite to wafer 26 when the latter is moved within the chamber. The distance between mask 29 and wafer 26 is about 10 mm. The mask pattern 29a on mask 29 is formed by conventional lithographic techniques on a sythetic quartz substrate 29. A photoelectric layer 29c, such as CsI layer is formed on mask pattern 29a. The mask 29 has a third set of spaced alignment marks $M_3$ formed as parts of the mask pattern; they are placed at a position corresponding to the second marks $M_2$ on wafer holder 27. Also provided are a fourth set of spaced alignment reference marks $M_4$ formed as part of the mask pattern; they are placed at a reference position corresponding to first marks $M_1$ on wafer 26. In accordance with the alignment system of the invention, the first set of marks $M_1$ on wafer 26 are brought into registration with the fourth set of marks $M_4$ on photocathode mask 29. The process for accomplishing such alignment is explained later in detail.

Photocathode mask 29, thus formed, is supported above wafer 26 by any suitable supporting means (not shown); thus, when screening plate 18 is removed from its position between source 15 and mask 29 ultraviolet light passes through the transparent portions of mask 29. A DC power source 30 is provided to apply a high DC voltage of about 20 Kv between photocathode mask 29 and wafer holder 27.

Figure 4:
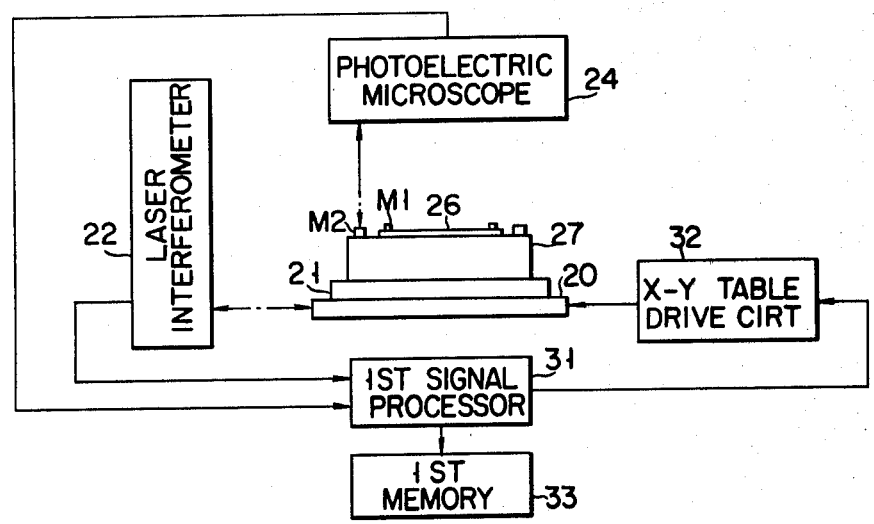
FIGS. 4–6 are block diagrams of the electrical circuits used for controlling the alignment process of the device shown in FIG. 1.

The alignment process will now be explained in conjunction with FIGS. 4-7. First, the X-Y table 20 on which semiconductor wafer 26 is mounted is located at the farthest right-hand portion of preparatory chamber 11b. Laser interferometer 22 detects the position of the X-Y table 20 and supplies output signals representing the position of table 20 to a first signal processor 31. Signal processor 31 generates an X-Y table control signal and feeds the signal to X-Y table drive circuit 32. Drive circuit 32 drives table 20 to the left in accordance with the control signal. As shown in FIG. 4, photoelectric microscope 24 detects the second mark $M_2$ on wafer holder 27 and generates a first output signal when mark $M_2$ is aligned with the optical axis of the photoelectric microscope 24 while X-Y table 20 is moving to the left. The output signal from microscope 24 is supplied to signal processor 31. Processor 31 detects the output signal of interferometer 22 at the time mark $M_2$ is detected and stores this information into a first memory 33. Drive circuit 32 continues to drive the X-Y table to the left and microscope 24 generates a second output signal when mark $M_1$ on wafer 26 is detected, as shown in FIG. 2. Signal processor 31 detects the output signal of interferometer 22 at the time mark $M_1$ is detected and temporarily stores this information into the memory 33. Processor 31 then reads the temporarily stored interferometer output signals from memory 33 and calculates the difference between the two position signals. The difference thus obtained represents the relative distance $L_1$ between first mark $M_1$ and second mark $M_2$ as shown in FIG. 7. The signal corresponding to distance $L_1$ is then stored in the memory 33. This same process is repeated for the other marks of sets $M_1$ and $M_2$.

Figure 5:
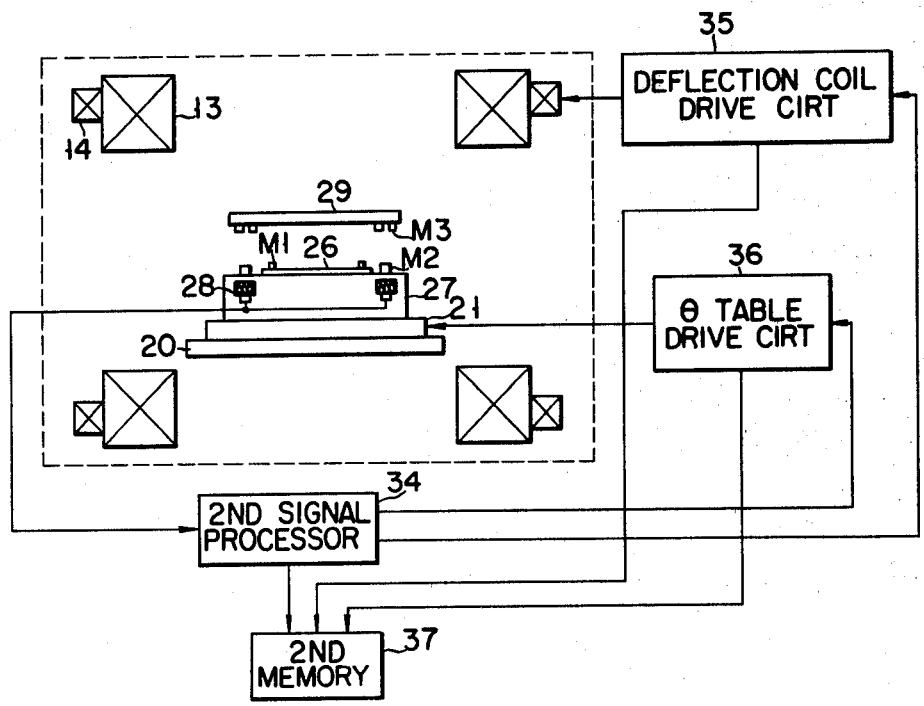

X-Y table 21 is further moved by drive circuit 32 to a position directly below the photocathode mask 29 within sample chamber 11a, as shown in FIGS. 1 and 5. Ultra-violet light from light source 15 irradiates only the third marks $M_3$ on the mask 29 through the transparent portion 18a of screening plate 18. Photoelectrons are emitted from mark $M_3$ and, due to the force created by deflection magnet 14 and the electric field, are accelerated downwardly and impinge upon holder 27 in the neighborhood of second marks $M_2$. The second mark $M_2$, assuming it consists of heavy metal, emits X-rays; the detected amount of these X-rays correspond to the extent of misalignment between second mark $M_2$ and third mark $M_3$. These X-rays are detected by detector 28 in holder 27. Alternatively, if the second mark $M_2$ consists of a through hole, formed in holder 27, the detected amount of photoelectrons correspond to the extent of misalignment.

The detected output of detector 28 is a maximum when the both marks $M_2$ and $M_3$ are aligned. As shown in FIG. 7, on the other hand, if there is misalignment between the marks $M_2$ and $M_3$, the detected output is diminished to an extent corresponding to the amount of this misalignment; consequently, the extent of the misalignment between marks $M_2$ and $M_3$ is detected by the detector 28. As shown in FIG. 5, the output signals of detector 28 are supplied to a second signal processor 34 for controlling the deflection coil drive circuit 35 and table drive circuit 36, respectively, to make the detected output a maximum. More specifically, the deflection coil drive circuit 35 controls the electric current supplied to produce the deflection magnetic field which is perpendicular to the focusing magnetic field. As shown in FIG. 7, the photoelectrons emitted from the third mark $M_3$ and projected on the wafer holder (as shown by an arrow I) are deflected by an amount to cause incidence on second mark $M_2$ (as shown by an arrow II). Simultaneously, table drive circuit 36 drives the rotating table in the $\theta$ direction causing alignment in the $\theta$ direction of second mark $M_2$ and third mark $M_3$.

Misalignment between the second mark $M_2$ and the third mark $M_3$, as projected, is thus corrected. The deflection coil drive signal and the $\theta$ table drive signal are stored in a second memory 37. This signal (i.e., PO) represent the relative position of marks $M_2$ and $M_3$, as projected, before alignment. Generally, at this time, first mark $M_1$ and fourth mark $M_4$ are misaligned since the distance $L_1$ between mark $M_1$ and $M_2$ is different for each wafer even though the distance $L_2$ between marks $M_3$ and $M_4$ is a known constant value. In the next step, therefore, the final alignment between first mark $M_1$ on the each wafer 26 and the fourth reference mark $M_4$, as projected on the wafer holder, must be obtained.

Figure 6:
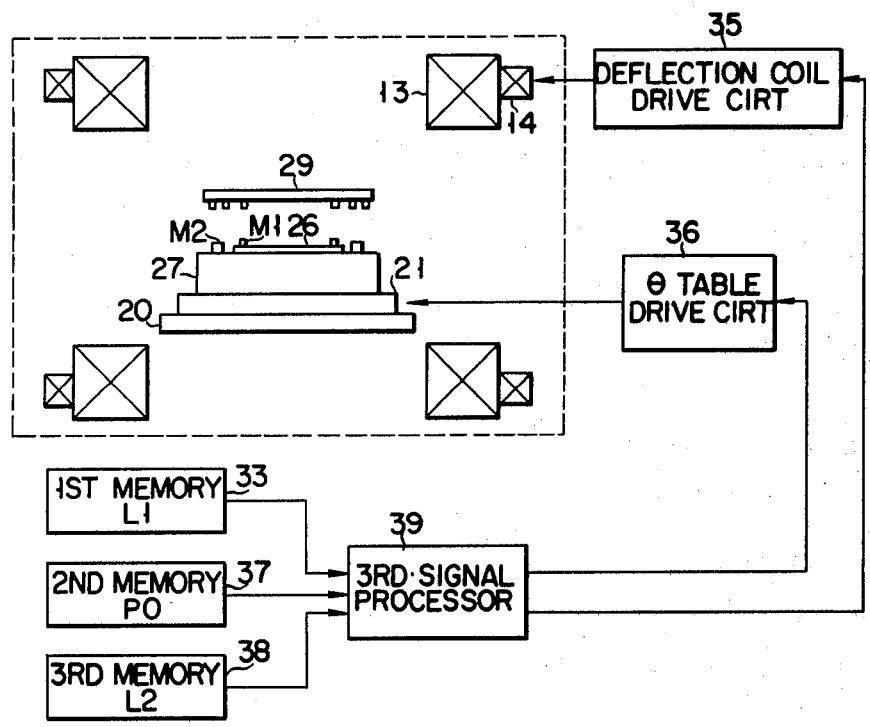
Figure 7:
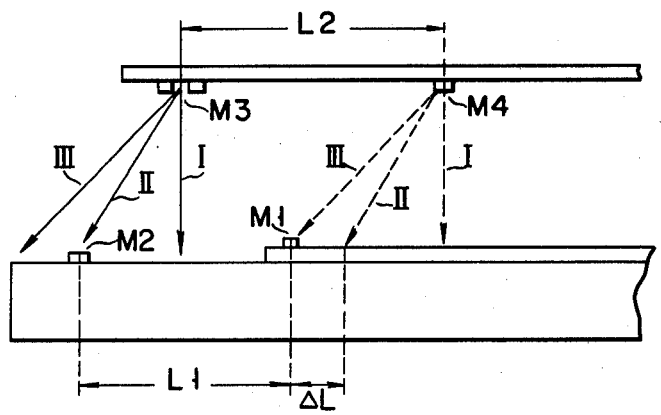
FIG. 7 is a diagram explaining the operation of the embodiment shown in FIG. 1.

In FIG. 6, the information stored in first memory 33, the second memory 37 and the third memory 38 are, respectively, the distance $L_1$ between marks $M_1$ and $M_2$, the relative position PO of marks $M_2$ and $M_3$ before alignment, and the distance $L_2$ between marks $M_3$ and $M_4$. This information is, respectively, read out and supplied to a third signal processor 39. Processor 39 calculates the difference $\Delta L$ between the distances $L_1$ and $L_2$ (i.e. $\Delta L = L_1 - L_2$) and converts the difference $\Delta L$ into a drive signal for deflection coil drive circuit 35. Drive circuit 35 then drives the deflection coil 14 so as to give further deflection to the photoelectrons corresponding to the distance $\Delta L$ along the surface of wafer 26, as shown by arrow III in FIG. 7. As shown in FIG. 7, during the final alignment process, photoelectrons emitting from mark $M_4$ are projected onto the wafer and deflected from the position II to position III; thus the final alignment between marks $M_1$ and $M_4$ as projected, is completed. Screenplate 18 is then removed and the entire pattern on the photocathode mask 29 is transferred to the wafer 26.

With the above described embodiment of the invention, misalignment between the mask and the semiconductor wafer is corrected by deflecting the photoelectrons by an amount based upon the relative positions between marks $M_1$ and $M_4$; alignment can be obtained having an accuracy of less than 0.1 $\mu$m. Further, since a heavy metal mark or through-hole mark is provided on the holder, instead of the wafer itself, no difficulty is encountered in forming such marks on each wafer, or adverse effects realized by contamination.

Figure 8:
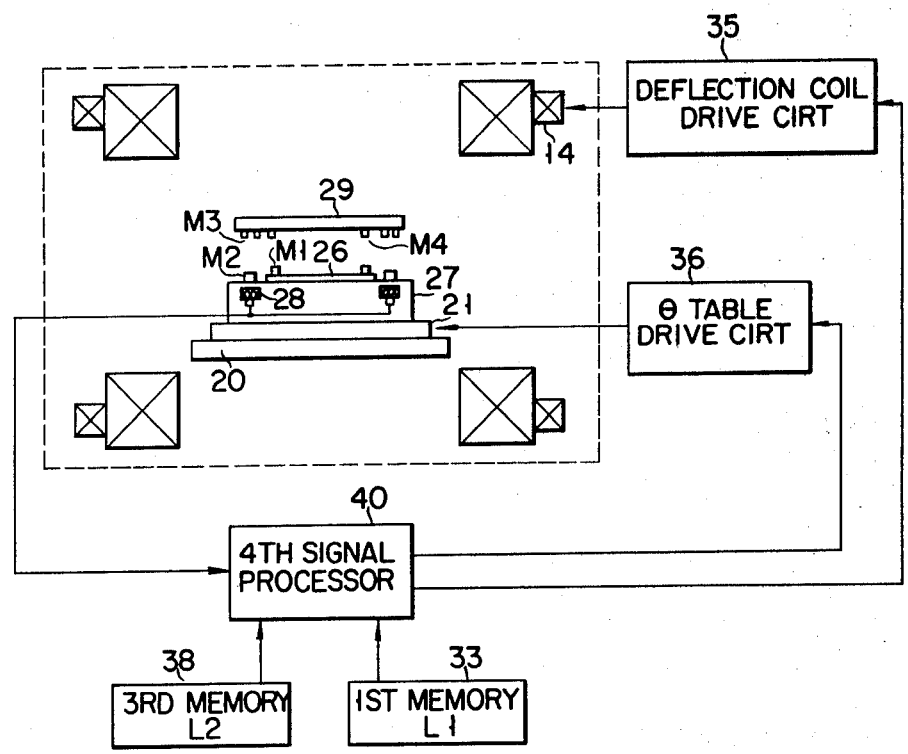
FIG. 8 is a block diagram showing another embodiment of the invention.
Figure 9:
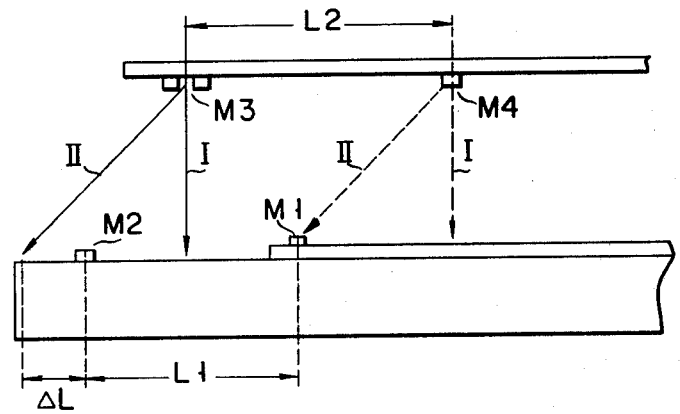
FIG. 9 is a diagram explaining the operation of the embodiment shown in FIG. 8.

It should be noted that there are various modifications within the scope of the invention. If the amount of misalignment between the photocathode mask and the wafer is small enough to be within the range of the detection of detector 28, the alignment process will be more simplified. This simplified alignment process will be discussed with reference to FIG. 8. The same parts in FIGS. 6 and 8 are given the same reference numerals and a detailed explanation therefore is omitted. One difference between these embodiments is the omission of second memory 37 in FIG. 6. A fourth signal processor 40 accurately calculates the amount of misalignment ($\Delta L$) between second mark $M_2$ and third mark $M_3$. The beam is then deflected until a maximum output is received from detector 28, corresponding to impingement of the beam on $M_2$. The processor 40 then further controls the deflection drive circuit 35 and the rotating table circuit 36 so that further deflection occurs producing an alignment between the marks $M_2$ and $M_3$ equal to $\Delta L$, as shown in FIG. 9. According to this embodiment, since storage of the misalignment signal (PO) representing the initial misalignment of marks $M_2$ and $M_3$ is omitted, the entire process is carried out in a shorter time and more easily. It is possible to omit the initial alignment step of $M_2$ and $M_3$ in this embodiment since the difference ($\Delta L$) between $L_1$ and $L_2$ is within the detection range of detector 28 and the further deflection can be made until detector 28 senses that $M_2$ and $M_3$ (as projected) as spaced by $\Delta L$.

Figure 10:
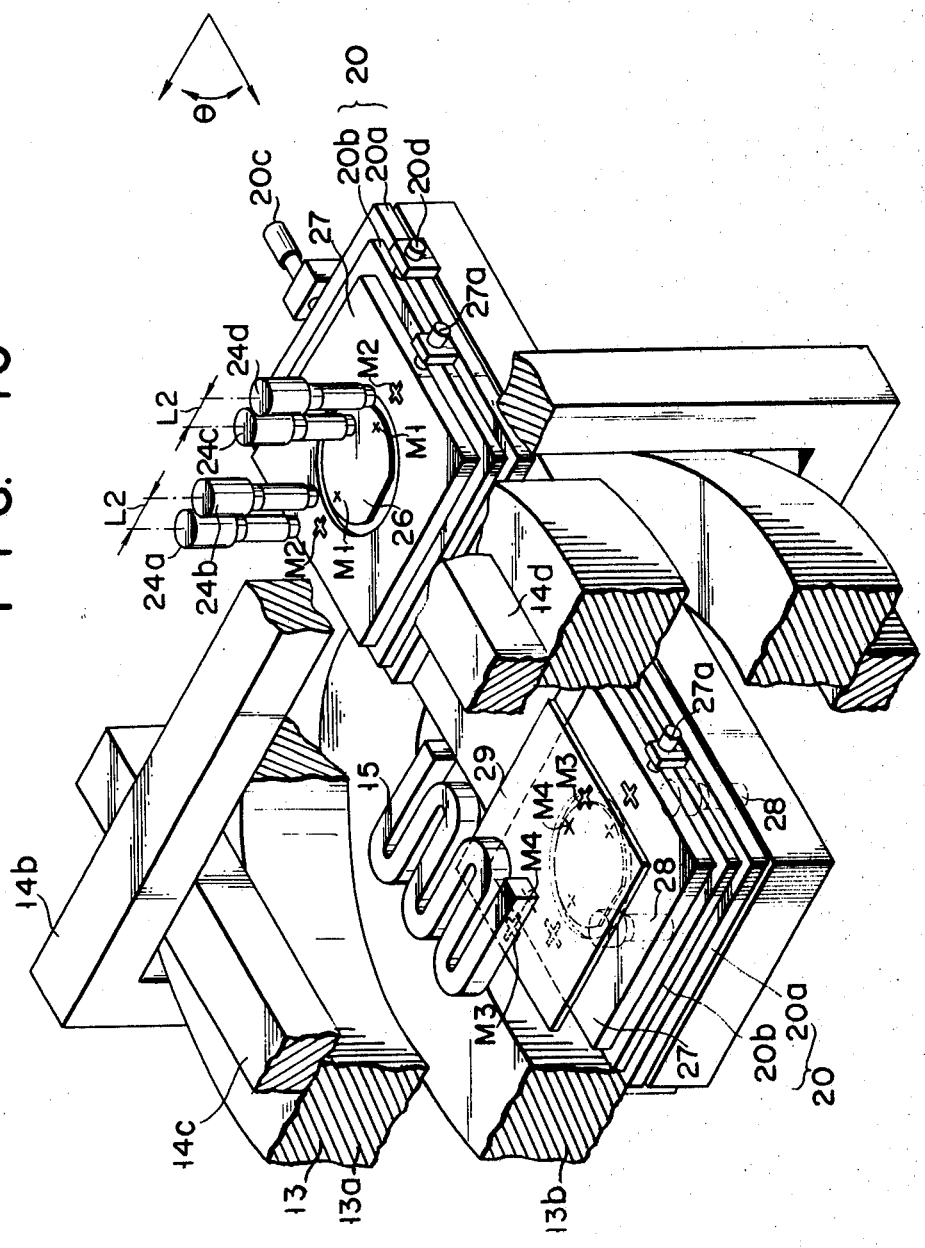
FIG. 10 is a perspective view of another embodiment of the invention shown in FIG. 2 wherein a plurality of microscopes are used.

Although the measuring of the distance $L_1$ is made by using only one photoelectric microscope, it is easier if a plurality of microscopes are used. FIG. 10 shows an example in which four microscopes are provided for measuring the distance $L_1$. In FIG. 10, four microscopes 24a–24d are arrayed in a straight line parallel to the Y axis. Alignment marks $M_1$ and $M_2$ are also arranged in a straight line parallel to the Y axis. Alignment marks $M_3$ and $M_4$ on mask 29 are also arranged in a straight line parallel to the Y axis. X-Y table 20 consisting of an X table 20a and Y table 20b are moved by a driving means 20c and 20d. A wafer holder 27 is rotated in the $\theta$ direction by driving means 27a. Since other parts of the device are the same as those shown in FIGS. 1 and 2, further explanation is omitted except for the alignment process.

According to this embodiment, four microscopes 24a–24d are arranged so that the relative position of each microscope corresponds to each of the marks $M_3$ and $M_4$. Accordingly, the distances between the first and second microscopes 24a and 24b are equal to the distance between the marks $M_3$ and $M_4$ (i.e., $L_2$). The distance between the third and fourth microscopes 24c and 24d is also equal to $L_2$. When the wafer holder 27 on which wafer 26 is brought under the microscope array 24a–24d, the microscope array detects the corresponding marks $M_1$ and $M_2$ within its field of view. Each of the microscopes provides an output signal having an amplitude proportional to the distance the detected mark is spaced from the microscope's optical axis (i.e., $\Delta L$). It is possible to detect the distance $L_1$ between the first and second mask $M_1$ and $M_2$ by detecting the output signals of the microscope array. Since the first and second microscopes 24a and 24b are spaced by the distance $L_2$, the output signals of the microscopes detected the difference $\Delta L$; as previously discussed, $\Delta L$ is the difference between distance $L_2$ and the distance between the marks $M_1$ and $M_2$ (i.e., $L_1$). The distance $L_1$ can also be obtained from the equation $L_1 = L_2 - \Delta L$. This calculation can be done by providing the output signals to a signal processor, such as the one shown in FIGS. 4–6. Thus, using a microscope array, not only can the difference $\Delta L$ between $L_1$ and $L_2$ be obtained in one step, but also the distance $L_1$ can be obtained. Moreover, using a microscope array, the misalignment of the wafer in the $\theta$ direction can be detected as well as the difference $\Delta L$. This information is provided to a $\theta$ table drive circuit 36, such as the one shown in FIGS. 6 or 8, to align the mask and the wafer by rotating it an appropriate amount.

Figures 11A, 11B, 11C:
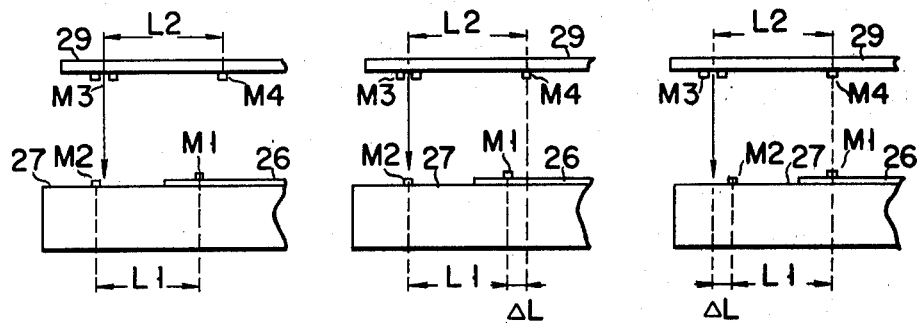
FIGS. 11(a)–11(c) are diagrams explaining the operation of a further embodiment of the invention.
Figure 12A:
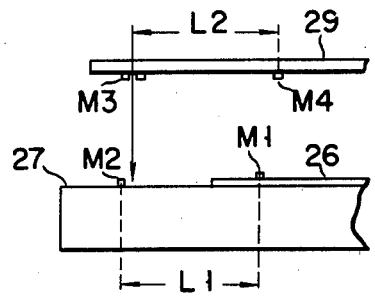
FIGS. 12(a)–12(b) are diagrams explaining the operation of a still further embodiment of the invention.
Figure 12B:
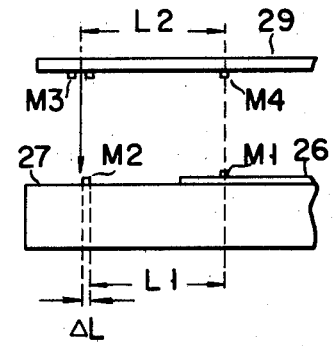

Although correcting of misalignment can be carried out by utilizing the deflection coil as discussed in the above embodiments, correction could also be performed by moving the X-Y, table as shown in FIGS. 11 and 12. FIGS. 11(a)–(c) show the alignment steps by moving the X-Y table with the embodiment shown in FIGS. 4–6. FIG. 11(a) shows the relative positions of the wafer holder 27 and the photocathode mask 29 when the X-Y table 20 is first brought into the sample chamber 11a. FIG. 11(b) shows the relative positions when table 20 is moved so that marks $M_2$ and $M_3$ are aligned. FIG. 11(c) shows the final alignment position when marks $M_1$ and $M_2$ are aligned. FIGS. 12(a) and (b) show the aligning process by moving the X-Y table with the embodiment shown in FIG. 8. It should be understood that each of the alignment steps of FIGS. 11 and 12 corresponds to each step discussed with reference to FIGS. 7 and 9, respectively, except that the table is moved for alignment rather than correcting the beam deflection angle. Likewise, the table is moved so that the $M_2$ and $M_3$ (as projected) are spaced by $\Delta L$.

It should be noted that the second mark $M_2$ is not restricted to a heavy metal mark or through hole. Other kinds of marks can be used which produce signals depending on photocathode illumination. Finally, the use of an actual fourth mark $M_4$ placed on the photocathode mask is not necessary since merely preselecting a known distance $L_2$ between the mark $M_3$ and an imaginary mark $M_4$ is sufficient for the alignment according to the invention. That is, the correction signal $L$ to produce alignment can be obtained merely from knowing $L_2$ and $L_1$ ($\Delta L = L_2 - L_1$).

Although the explanation was principally made with respect to aligning along the X direction, the same principles apply in aligning along the Y direction or $\theta$ direction.

We claim:

1. An electron beam pattern transfer device for projecting a mask pattern onto the surface of a semiconductor wafer comprising:
   a vacuum vessel;
   a light source for emitting light into the vacuum;
   a pattern mask having a photocathode surface disposed in the vessel to receive the emitted light and emitting photoelectrons in accordance with the pattern on the mask;
   a wafer holder for supporting the semiconductor wafer;
   a movable table for moving the wafer holder to a position opposite to the pattern mask;
   a focusing and accelerating means for focusing and accelerating the electrons emitted from the photocathode mask pattern and projecting the pattern images on said wafer;
   a first detecting means for detecting a relative distance $L_1$ between a first mark $M_1$ provided on the surface of the semiconductor wafer and a second mark $M_2$ provided on the surface of the wafer holder;
   said mask pattern having both a third mark provided on its photoelectric surface and a reference position, spaced a known distance $L_2$ from said third mark;
   means for adjusting the relative position of the second mark and the third mark, as projected on the wafer holder, so that the relative distance between said marks is equal to the difference between the distance $L_1$ and the known distance $L_2$ so that the reference position, as projected on the wafer, and the first mark are aligned.

2. An electron beam pattern transfer device according to claim 1, wherein said adjusting means further comprises a deflection coil and a drive circuit thereof for deflecting the photoelectron beams emitted from said photocathode pattern mask along the semiconductor wafer.

3. An electron beam pattern transfer device according to claim 2, wherein said second mark is formed by a heavy metal which emits X-rays when irradiated by photoelectrons.

4. An electron beam pattern transfer device according to claim 2, wherein said second mark is formed by a through hole.

5. An electron beam pattern transfer device according to claim 3 or 4, wherein the vacuum vessel comprises a sample chamber and a preparatory chamber, and the first detecting means further comprises:
   a photoelectric microscope mounted adjacent said sample chamber for detecting the first and second marks provided on the semiconductor wafer and the holder thereof respectively;
   a laser interferometer for measuring the position of the movable table by emitting a laser beam towards, and detecting the reflected beam from, said movable table; and
   a first signal processor for detecting the distance $L_1$ from the output signals of the laser interferometer and the photoelectric microscope.

6. An electron beam pattern transfer device according to claim 5, further comprising:
   second detecting means for detecting either X-rays or photoelectrons emitted by the second mark;
   a second signal processor, coupled to said second detecting means, for providing a control signal to the deflection coil drive circuit to vary the deflection of the electrons until the output signal of the detector is a maximum.

7. An electron beam pattern transfer device according to claim 6, wherein the adjusting means further comprises:
a third signal processor for generating a control signal representing the difference between the distance $L_1$ and $L_2$ and supplying the control signal to said deflection circuit to further deflect the photoelectrons along the surface of the wafer holder by an amount corresponding to this difference.

8. An electron beam pattern transfer device according to claim 5, wherein the adjusting means further comprises a second signal processor, coupled to the second detecting means, for generating a control signal representing the relative distance between the second mark and the third mark and supplying the signal to the deflection coil drive circuit to further deflect photoelectrons until the relative distance is equal to said difference.

9. An electron beam pattern transfer device according to claim 1, wherein said adjusting means further comprises:
a laser interferometer for measuring the position of the movable table by emitting a laser beam towards, and detecting the reflected beam from, the movable table;
a movable table drive circuit for driving the table;
a first signal processor for controlling the movable table drive circuit so that the relative position of the second mark and the third mark, as projected, is equal to said difference.

10. A method for aligning a photocathode mask pattern and a semiconductor wafer supported on a holder thereof in an electron beam pattern transfer device comprising the following steps:
detecting a relative distance $L_1$ between a first mark provided on the semiconductor wafer and a second mark provided on the surface of the wafer holder;
determining a distance $L_2$ between a third mark provided on the pattern mask and a reference provided on the pattern mask;
projecting images of the third mark from said pattern mask onto said wafer holder;
adjusting the relative position of the second mark and the projected third mark so that the relative distance between said marks is equal to the difference between the distance $L_1$ and the distance $L_2$ so that the reference position, as projected on the wafer holder, are aligned.

11. A method according to claim 10, wherein the adjusting step comprises:
aligning the second mark and the third mark, as projected;
determining the difference between the distance $L_1$ and $L_2$; and
adjusting the relative distance between the second mark and the third mark, as projected, to be equal to said difference.

12. A method according to claim 11, wherein the adjusting step comprises the step of deflecting the photoelectrons so that the relative positions of the second mark and the third mark, as projected, equal said distance.

* * * * *